United States Patent [19]
Scafidi et al.

[11] Patent Number: 6,000,464
[45] Date of Patent: Dec. 14, 1999

[54] ELECTRONIC COMPONENT COOLING SYSTEM

[75] Inventors: Christopher J. Scafidi, Downington; David J. Pierce, Philadelphia, both of Pa.

[73] Assignee: InterDigital Technology Corporation, Wilmington, Del.

[21] Appl. No.: 08/852,845

[22] Filed: May 7, 1997

Related U.S. Application Data

[60] Provisional application No. 06/040,959, Mar. 12, 1997.

[51] Int. Cl.[6] .................................................... F28D 15/00
[52] U.S. Cl. ................................... 165/104.33; 165/80.3; 361/724; 361/384; 174/16 R
[58] Field of Search ........................... 165/104.33, 80.3; 361/724, 384; 415/208.1; 174/16 R

[56] References Cited

U.S. PATENT DOCUMENTS

| | | | |
|---|---|---|---|
| 683,447 | 10/1901 | Degge | 415/8 |
| 1,249,077 | 12/1917 | Hansley | 415/8 |
| 1,728,117 | 9/1929 | Freeman | 415/8 |
| 4,386,651 | 6/1983 | Reinhard | 165/104.33 |
| 4,399,485 | 8/1983 | Wright et al. | 174/16.1 |
| 4,644,443 | 2/1987 | Swensen et al. | 174/16.1 |
| 5,054,545 | 10/1991 | Ghaemian | 165/104.33 |
| 5,136,464 | 8/1992 | Ohmori | 361/694 |
| 5,462,404 | 10/1995 | Durth | 415/183 |
| 5,529,120 | 6/1996 | Howard et al. | 165/104.33 |
| 5,760,333 | 6/1998 | Kitahara et al. | 165/80.3 |
| 5,765,743 | 6/1998 | Sakiura et al. | 454/184 |

*Primary Examiner*—Ira S. Lazarus
*Assistant Examiner*—Terrell McKinnon
*Attorney, Agent, or Firm*—Volpe and Koenig, P.C.

[57] ABSTRACT

An electronic component cooling system for printed circuit board enclosures includes a plurality of fans, each coupled to an air deflection unit which selectively forces air from the fans through the printed circuit boards. The system includes at least one thermal diffuser and at least one air concentrator. The thermal diffuser is placed between a stack of two or more shelving units to avoid the development of hot spots or dead zones. The air concentrator provides the ability for certain components which have a high heat output to receive a greater amount of air flow than other components which have lower heat outputs.

21 Claims, 11 Drawing Sheets

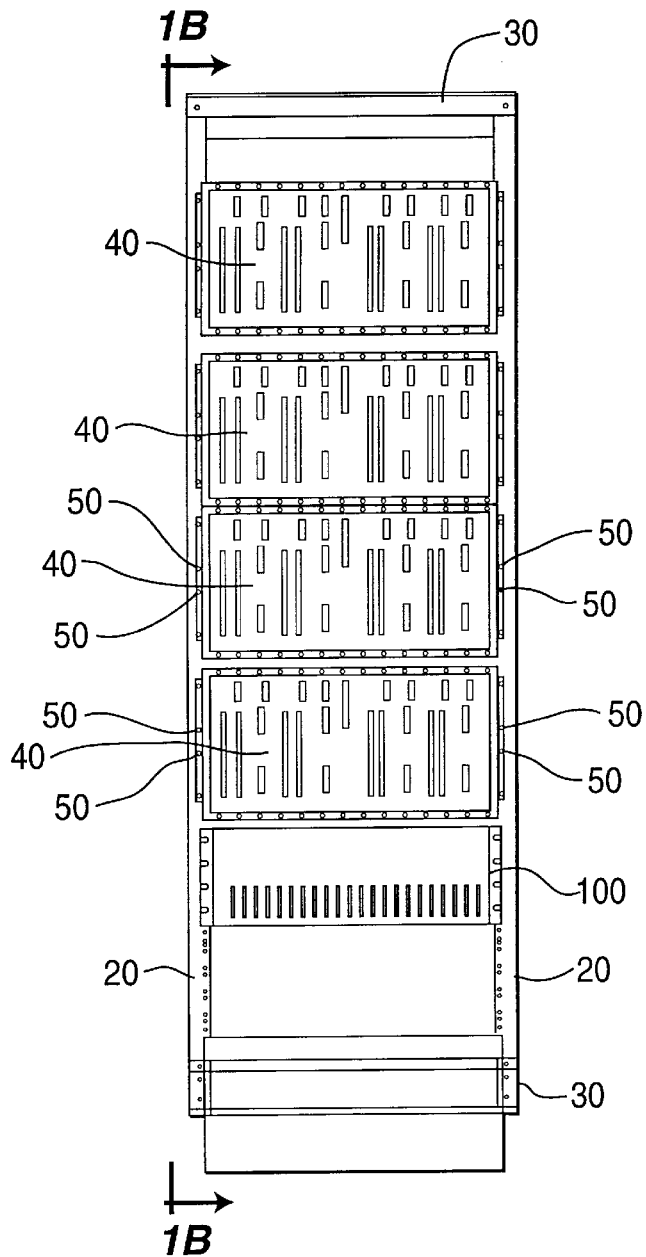
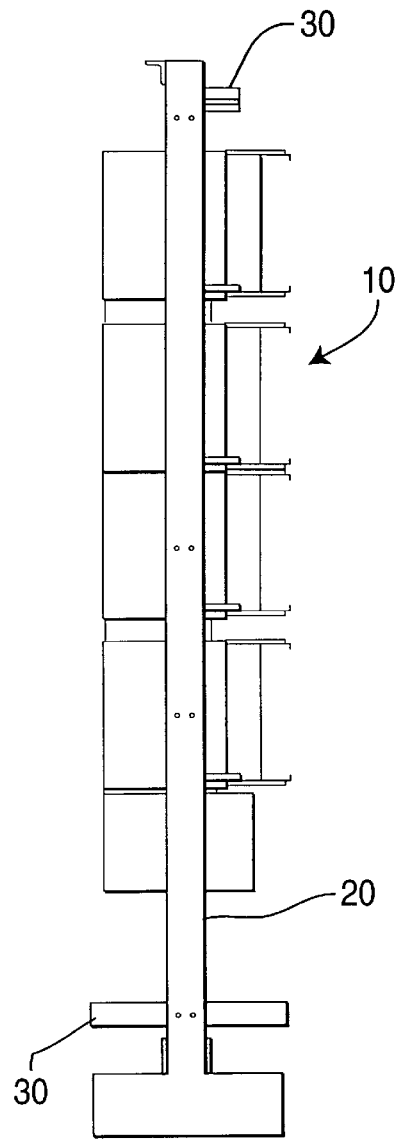
FIG. 1A  FIG. 1B

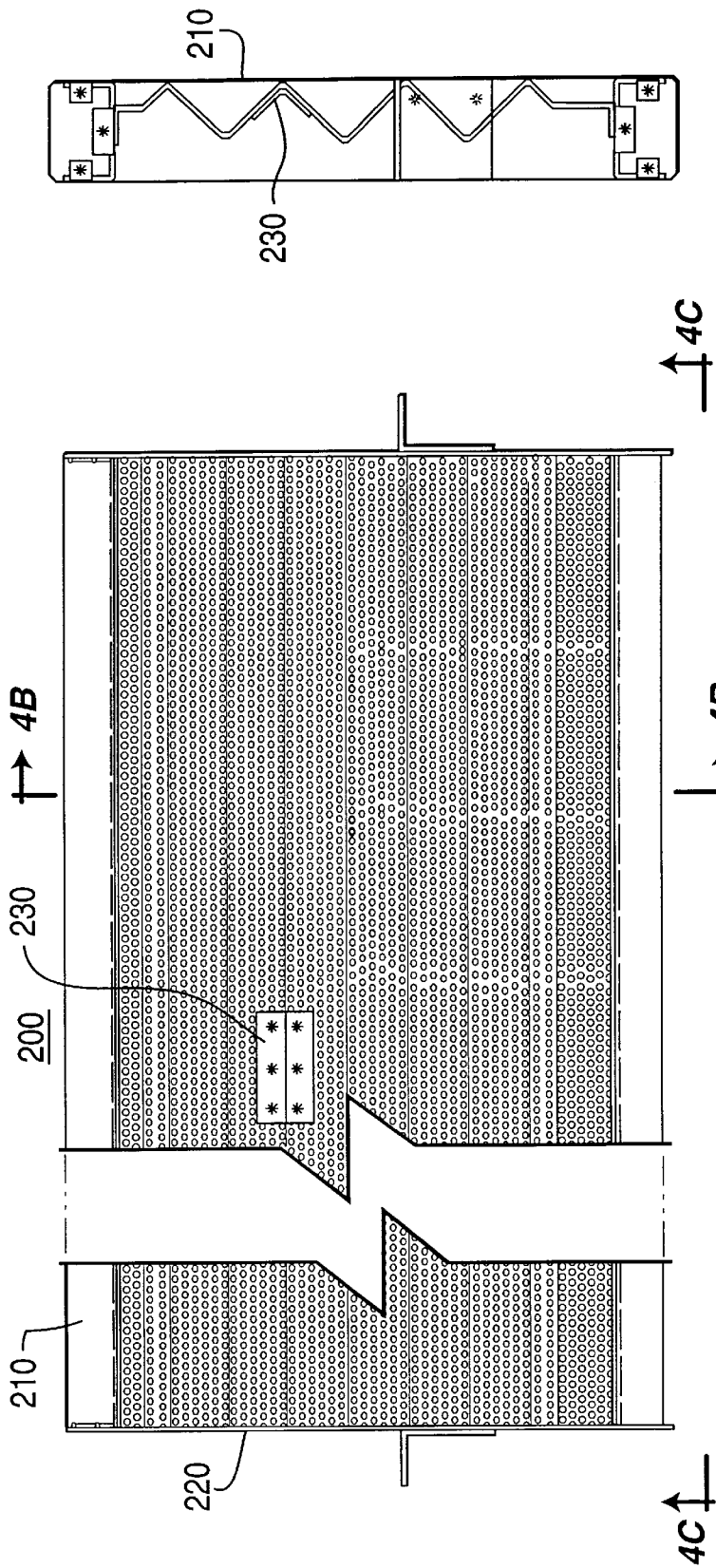
FIG. 4B
FIG. 4A
FIG. 4C

ELECTRONIC COMPONENT COOLING SYSTEM

This application claims benefit of provisional appln. 60/040,959 filed Mar. 12, 1997.

BACKGROUND OF THE INVENTION

1. Field of the Invention

The present invention generally pertains to a system for cooling electronic components mounted on an electronic component rack. More particularly, the invention pertains to a forced air electronic component cooling system which utilizes several fans and selectively configured air deflectors to provide uniform cooling of electronic components within a multilevel electronic component rack.

2. Description of Related Art

Electronic equipment, such as communication or computing hardware, typically comprises a plurality of printed circuit boards which are mounted within a shelving unit. Typically, a plurality of shelving units are stacked one upon the other in an enclosure. Enclosures are required in an outdoor environment to prevent environmental hazards such as rain, snow, sleet and flying debris from damaging the electronic components. For indoor environments, enclosures are used to prevent inadvertent damage to electronic components by people working in the vicinity of the enclosures.

One of the critical factors in maintaining a proper ambient environment for electronic components, whether outdoor or indoor, is to maintain the temperature of the enclosure within a desired operating range. The printed circuit boards must be cooled to ensure proper operation of the electronic circuits and to prevent premature electronic component degradation and failure. Since the number of electronic circuits on each printed circuit board has increased exponentially with the advance of VLSI circuit design, the thermal density of the printed circuit boards has also greatly increased. Providing adequate cooling for all printed circuit boards within an enclosure has become problematic.

To maintain cooling for a shelving unit which accommodates a plurality of printed circuit boards exhibiting a high thermal density, forced air cooling structures having fans are typically used. In this type of cooling structure, an important factor for realizing effective heat removal is not only the temperature of the cooling air which removes the heat from the circuit board, but also the velocity of the air flow.

There have been attempts in the prior art to address the cooling problems. For example, U.S. Pat. No. 3,967,874 discloses a printed circuit board mounting assembly which provides uniform cooling for an array of printed circuit boards. A fan is provided for each card cage, with each cage having a plurality of printed circuit boards mounted therein. A high velocity centrifugal fan blows air into in a plenum having a perforated screen. The screen is configured to include a series of crests and troughs which cause air turbulence. This uniformly directs the air flow through the screen and past the printed circuit boards. Although this assembly ensures adequate cooling by providing a separate fan for each printed circuit board cage, loss of the fan may result in severe damage of the printed circuit boards in that cage due to thermal overloading.

U.S. Pat. No. 4,399,485 discloses an air baffle assembly for mounting in a printed circuit board cage. The baffle maintains a constant uniform impedance to the flow of cooling air across a vacant space on a partially populated electronic mounting frame for printed circuit boards. The baffle assembly includes end boards mounted on opposite sides of the vacant space and a web member which extends between the boards. The web member has a plurality of small apertures to approximate the impedance presented by populated portions of the frame. This assembly utilizes a single fan to cool the printed circuit boards. Accordingly, failure of the fan would result in eventual failure or damage to the electronic components.

U.S. Pat. No. 4,774,631 discloses a cooling structure having a plurality of fans for cooling an electronic equipment rack. The structure comprises a plurality of shelving units stacked one upon the other. Each shelving unit has upper and lower venting apertures and accommodates a plurality of printed circuit boards. Each shelving unit is divided into a plurality of separate cooling blocks. The fan for each cooling block generates a flow of air through a portion of the shelving unit from bottom to top. Use of separate cooling blocks increases the risk that failure of the fan will result in degradation to components within that cooling block.

Accordingly, there exists a need for a forced air cooling system which provides adequate flow to each of the electronic components in an enclosure while providing redundancy in the case of fan failure.

SUMMARY OF THE INVENTION

An electronic component cooling system for printed circuit board enclosures includes a plurality of fans, each coupled to an air deflection unit which selectively forces air from the fans through the printed circuit boards. The system also includes at least one thermal diffuser and at least one air concentrator. The thermal diffuser is placed between a stack of two or more shelving units to avoid the development of hot spots or dead zones. The air concentrator provides the ability for certain components which have a high heat output to receive a greater amount of air flow than other components which have lower heat outputs.

Accordingly, it is an object of the present invention to provide a forced air cooling system which maintains adequate air flow to all electronic components within an enclosure while providing redundancy in the case of a fan failure.

Other objects and advantages will become apparent to those skilled in the art after reading the detailed description of a presently preferred embodiment.

BRIEF DESCRIPTION OF DRAWINGS

FIG. 1A is an elevation view of the electronic component frame made in accordance with the present invention;

FIG. 1B is a side elevation view of the electronic component frame of FIG. 1A;

FIG. 4A is a top view of a thermal diffuser comprising a rigid plate having a plurality of apertures;

FIG. 4B is a side view of the thermal diffuser of FIG. 4A;

FIG. 4C is a front view of the thermal diffuser of FIG. 4A;

DETAILED DESCRIPTION OF THE PREFERRED EMBODIMENT

Figure 1C:
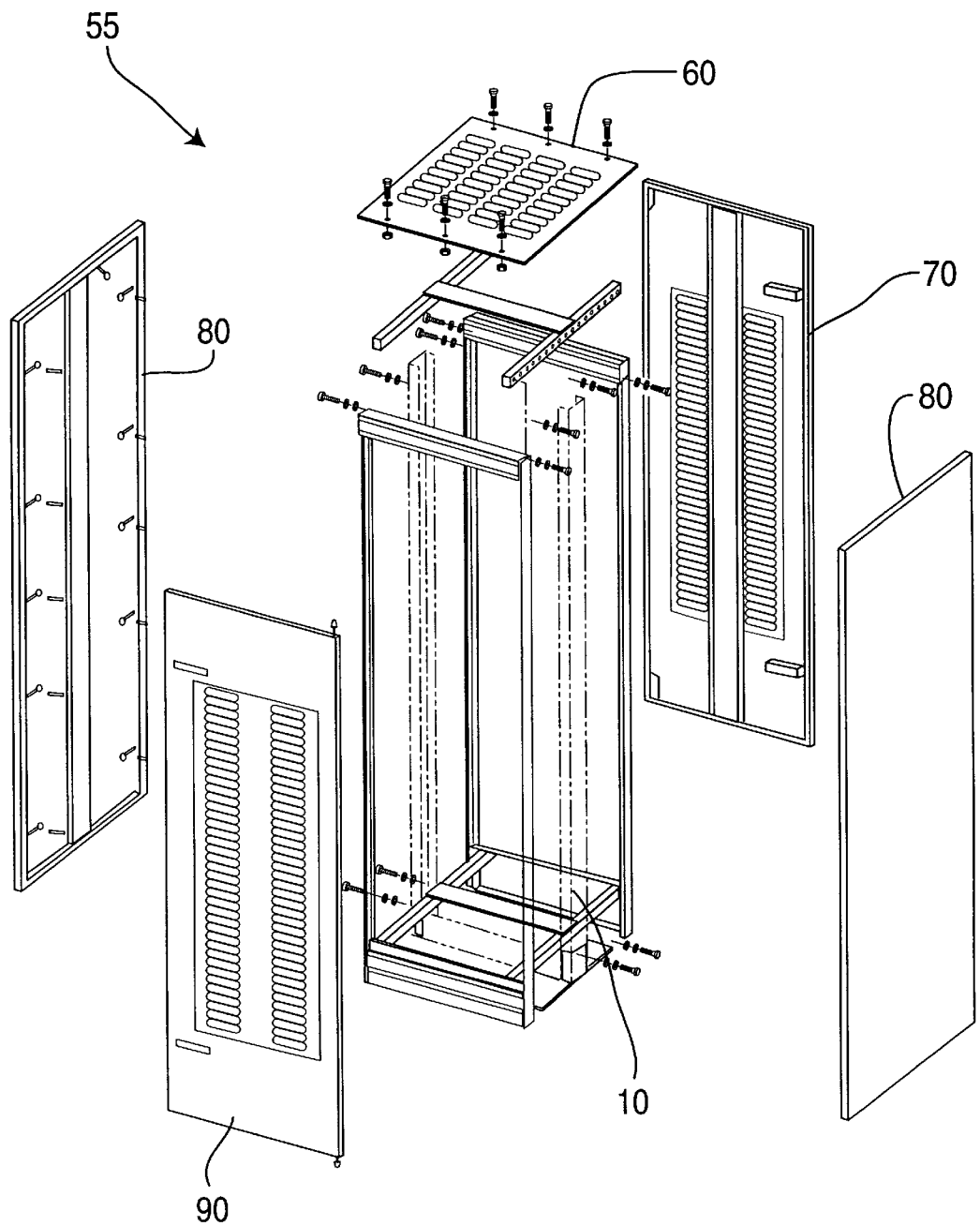
FIG. 1C is a metal outer structure housing the electronic component frame.

The preferred embodiment will be described with reference to drawing figures wherein like numerals represent like elements throughout. Referring to FIGS. 1A and 1B, an electronic component frame 10 made in accordance with the present invention is shown. The component frame 10 comprises two vertical struts 20 which are mounted together at the top and bottom by a plurality of horizontal struts 30 to form a rigid frame.

The two vertical struts 20 are provided with a plurality of apertures. Each electronic component shelving unit 40 fits between the vertical struts 20 and is secured to the vertical struts 20 by at least four bolts 50. The bolts 50 are inserted into the apertures for threadably coupling each shelving unit to the vertical struts 20. In this manner, a plurality of shelving units 40 may be located at any desired height within the housing.

The shelving units 40 may be generally categorized by the types of components which they hold: 1) printed circuit board shelving units; and 2) cooling system component shelving units. A printed circuit board shelving unit holds a plurality of printed circuit boards in a parallel vertical configuration. These shelving units are well known in the art and will not be described in detail hereinafter. The cooling system component shelving units made in accordance with the present invention may include active electrical components, such as fans, or passive mechanical components, such as diffusers and concentrators, as will be described in detail hereinafter.

Preferably, a metal outer enclosure 55, as shown in FIG. 1C houses the frame 10 to protect the frame 10 from the ambient environment. The metal outer enclosure 55 includes a vented top panel 60, a vented back panel 70, two side panels 80 and a hinged vented front door 90 for convenient access to electronic components therein. The venting regions may be selectively located at the top and the bottom of the enclosure 55 to permit cooler air from the ambient environment to enter the enclosure 55 and warmer air from within the enclosure 55 to be exhausted from the enclosure 55. Alternatively, as shown in FIG. 1C, the venting regions may be continuously located between the upper and lower venting regions as appropriate.

When a fan fails in the field, for example one fan out of a bank of four fans, the electronics directly above the failed fan will operate at elevated temperatures, thus lowering the operating life of that equipment. If the temperatures achieve a high enough elevation, component failure may result.

Figure 2:
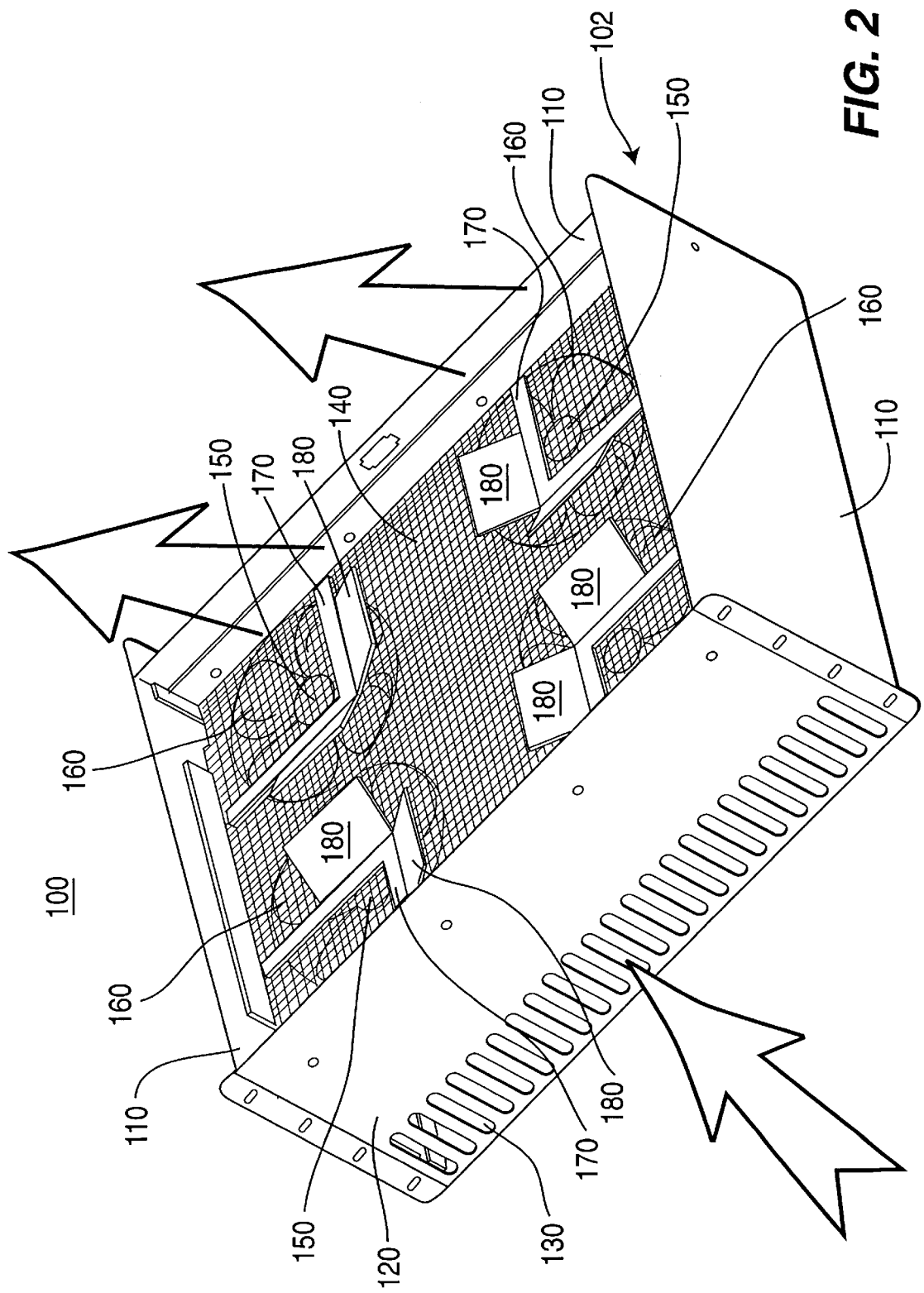
FIG. 2 is a blower assembly made in accordance with the present invention.

Referring to FIG. 2, a blower assembly 100 made in accordance with the present invention is shown. The blower assembly 100 comprises a box frame 102 having three solid sides 110 and a front face 120 with a plurality of cool air intake apertures 130. Displaced within the box frame 102 is a rigid screen 140 which permits air to flow therethrough. On the upper side of the screen 140 are located four air displacement assemblies 150. On the lower side of the screen 140 are located a plurality of electric fans 160. One fan 160 is located directly under each air displacement assembly 150.

Figure 3B:
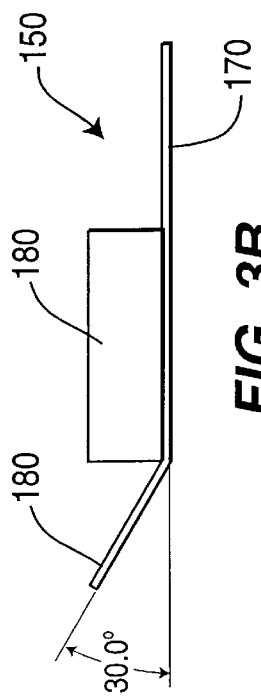
FIG. 3B is an elevation view of the air displacement assembly.
Figure 3A:
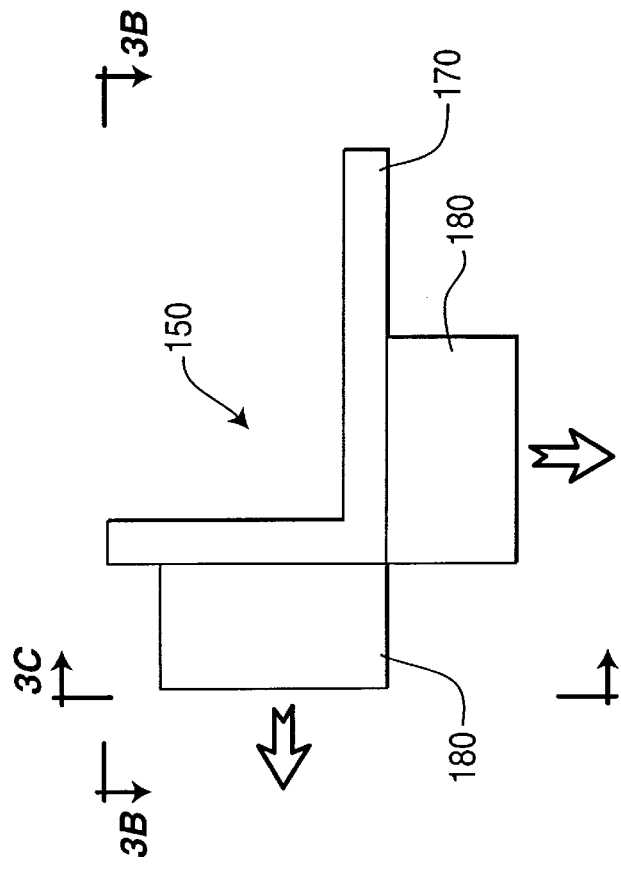
FIG. 3A is a top view of the air displacement assembly.
Figure 3C:
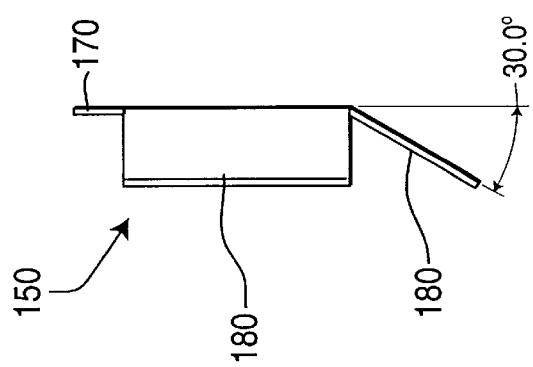
FIG. 3C is a side view of the air displacement assembly.

Each air displacement assembly 150 comprises a frame 170 and two air vanes 180, which are disposed at an angle with respect to the frame 170. The air displacement assemblies 150 are shown in greater detail in FIGS. 3A–3C. Referring to FIG. 3A, the frame 170, which is generally flat and L-shaped, provides a means for securing the vanes 180 to the rigid screen 140. The two vanes 180 are rigidly attached to the two outer sides of the L-shaped frame 170. As shown in FIGS. 3B and 3C, the vanes 180 are disposed at a deflection angle with respect to the plane of the frame 170. Preferably, the deflection angle is 30 degrees, although those skilled in the art should realize that the deflection angle depends upon many factors including the fan throughput, fan diameter, space available to generate turbulent flow, distance between the fans 160 and the number of fans 160. The deflection angle depends on the distance that the air is deflected. A larger space between the fans 160 would require a lower deflection angle. The angle is further lowered if the fan 160 must provide make-up flow for two adjacent inoperable fans 160. If the fans 160 are spaced very tightly, the deflection angle might be increased to 45 degrees. Accordingly, the deflection angle depends on system variables and the placement of the fans 160 for each particular application.

The air displacement assemblies 150 are designed such that the exhaust from the fan 160 is selectively displaced to provide "air flow redundancy". Referring to FIG. 3A, if the air exhausted from the fan 160 is directed normal to the plane of the figure, the first vane 180 directs approximately 25% of the airflow away from normal in a first direction. The second vane 180 directs an additional 25% of the flow away from normal in a second direction. The remaining 50% of the air flows without obstruction in a direction normal to the plane of the figure.

As the air exits the blower assembly 100, the air displacement assemblies 150 redirect the air into the area of the failed fan 160. When using the blower assembly 100 in accordance with the present invention, air will be directed into the deadened air space above the failed fan 160 and the printed circuit boards above the failed fan 160 will receive cooling air that has been redirected. The redirected air will lower the temperatures of the components thus preserving the anticipated life of the component.

In operation, referring back to FIG. 2, cool air is drawn through the cool air intake apertures 130 and is forced by the plurality of fans 160 up through the rigid screen 140. Approximately 50% of the output of each fan 160 is exhausted straight through the rigid screen to the electronic component shelving unit 40 located above the blower assembly 100. The remaining 50% of the air flow is directed toward the two adjacent fans 160. Although 50% of the output of each fan 160 is deflected away from normal, the output from the two adjacent fans 160 will make up this difference.

When all fans 160 are operating properly, the air flow output from above each fan 160 will be 100%. When a fan failure occurs, the flow output from above the nonoperating fan 160 will be reduced to approximately 50%. The air flow from above the two adjacent fans 160 will be reduced to approximately 75%. Thus, in the event of a fan failure, at least 50% of output air flow will be maintained for all printed circuit boards located above the blower assembly 100. This permits uninterrupted operation of the electronic system located within the enclosure 55 and increases the reliability of the system.

The present invention provides many advantages over prior art designs. If the system backpressure is high and the required volumetric air flow (CFM) is also high, in order to provide redundancy and uniform coverage, present systems utilize multiple banks of small fans. However, there are many disadvantages in using banks of small fans. Fan banks typically are only suitable for low static pressure systems. Fan banks are more expensive, less power efficient, have more undesirable acoustic noise and incur a lower mean time between failures (MTBF) due to their smaller bearings, higher speeds and operation in the unstable region of the fan performance curve. Additionally, fan banks typically require more space, thereby resulting in volumetric inefficiencies.

Typically, in the event of a fan failure, the internal temperature of the enclosure 55 will rise to a certain point and an alarm will go off to alert and dispatch repair personnel to the site. Since air is continually deflected into the zone above the failed fan 160, (the "dead zone"), the temperature of the components above the dead zone will be maintained lower and the need for repair personnel to immediately visit the site will be reduced. This results in several cost savings. First, the operating life of the components within the cabinet will be maintained. Secondly, emergency dispatching of repair personnel will be avoided. Repair personnel will be able to schedule a repair visit in the normal course of business. Finally, the system will continue to operate, thereby avoiding system outages to due to cooling component failure.

Although the blower assembly 100 provides a novel method for insuring that a nominal flow of cooling air is output to each cross-section of the enclosure 55, as the cooling air flows up through each subsequent shelving unit 40, the air flow is channeled and deflected by the printed circuit boards. As a result, dead zones or hot spots of air may develop whereby certain areas within the enclosure 55 do not receive sufficient air flow. Additional measures must be taken to ensure that adequate air flow is maintained throughout the entire enclosure 55 until the warm air is exhausted through the top of the enclosure 55. The cooling system of the present invention utilizes two separate assemblies to avoid any dead zones: 1) a thermal diffuser 200; and 2) an air concentrator assembly 300. The thermal diffuser 200 is shown in FIGS. 4A–4G.

The thermal diffuser 200 mixes the airflow exiting a lower shelving unit 40 so that the thermal hot spots are dissipated with minimal pressure drop and flow restriction. To accomplish this, the thermal diffuser 200 directs the air flow in different directions to cause warmer and cooler air molecules to mix and lower the temperature of the hot spots. This permits higher powered heat-generating electronic modules to be located under temperature sensitive modules. Therefore, the output or heat sensitivity of each module need not be considered when locating the electronic components, and electronic components may be located within the enclosure 55 based upon their function.

The thermal diffuser 200, as shown in FIG. 4A, comprises a rigid plate 210 having a plurality of apertures 220 therein. The apertures 220 permit the free flow of cooling air while facilitating the mixing of cooler and warmer air. As shown in FIG. 4B, the plate 210 is accordion-shaped with "baffles" to facilitate mixing of cooler and warmer air molecules. This structure effectively provides an even distribution of warm and cool air masses such that hot spots and dead zones are reduced or eliminated. The thermal diffuser 200 has the same width and depth dimensions of a printed circuit board shelving unit 40. Accordingly, it is coupled to the vertical struts 20 via two mounting brackets in the same manner as a standard printed circuit board shelving unit 40. As shown in FIG. 4C, however, the thermal diffuser 200 is less than two inches in height, thus conserving the usable space for operating electronic components.

Figure 4D:
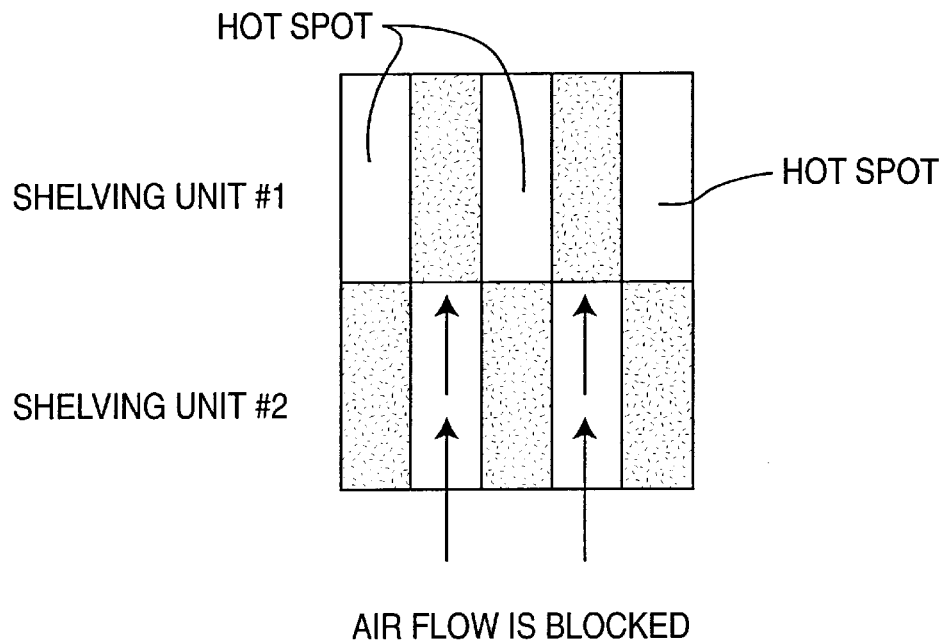
FIG. 4D illustrates the air flow between shelving units without the thermal diffuser in place.
Figure 4E:
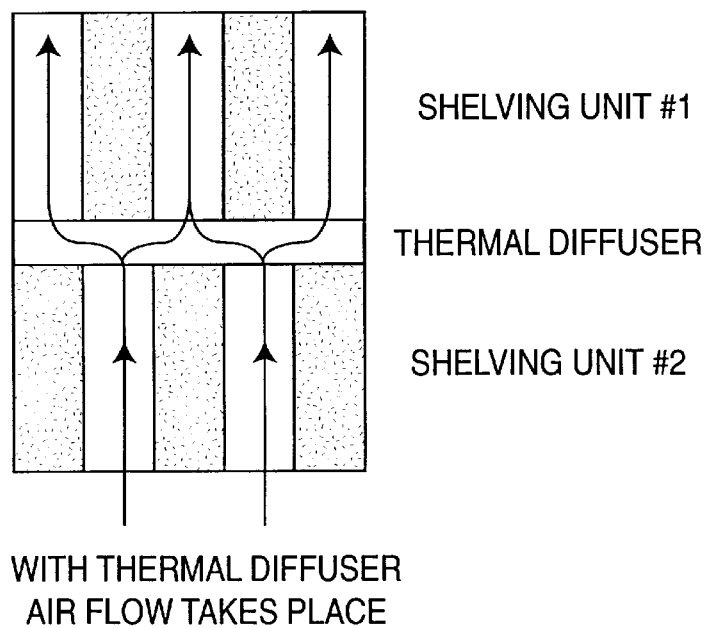
FIG. 4E illustrates the air flow between shelving units with the thermal diffuser in place.
Figure 4F:
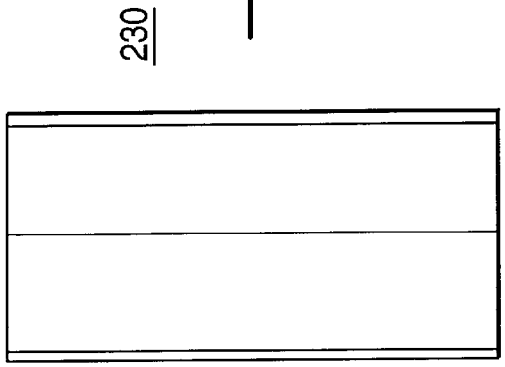
FIG. 4F is a top view of the deflector bracket.

Referring to FIG. 4D, without the thermal diffuser 200 in place, the air flow will be blocked if the printed circuit boards are mounted on different centers. However, as shown in FIG. 4E, the thermal diffuser 200 permits printed circuit board shelving units 40 with different spacing between the printed circuit boards to be mounted in the same equipment rack.

Figure 4G:
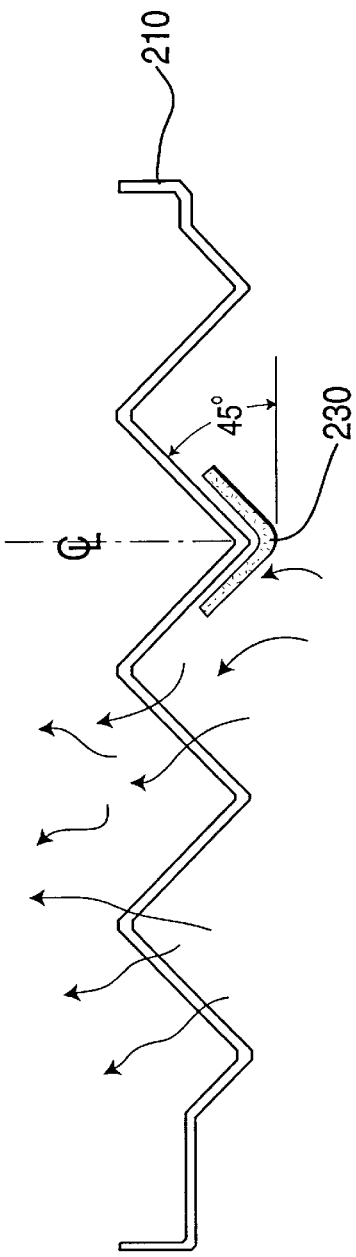
FIG. 4G is a front view of the deflector bracket mounted on the thermal diffuser.

In a further aspect of the invention, the thermal diffuser 200 is provided with one or more deflector bracket 230, shown in FIG. 4A. The deflector bracket 230, is shown in greater detail in FIGS. 4F and 4G. The deflector bracket 230 is shaped at a 45 degree angle to facilitate coupling to the thermal diffuser 200. Referring to FIG. 4G, the shape of the deflector bracket 230 permits tight coupling to the thermal diffuser 200. The deflector bracket 230 may be located under the thermal diffuser 200 as shown in FIG. 4G, or over the thermal diffuser 200. If the thermal diffuser 200 and bracket 230 are constructed from a metallic material, the deflector bracket 230 may be welded in place. Alternatively, the deflector bracket 230 may be magnetized. This permits the removal and insertion of deflector brackets 230 as different printed circuit board shelving units 40 are relocated under or over the thermal diffuser 200. As is well known to those skilled in the art, other materials having the ability to withstand the temperatures for a particular application may be used. In operation, as air flows through the thermal diffuser 200, the baffles within the thermal diffuser 200 create turbulence to mix the air and provide a more uniform air temperature and velocity output to the next shelving unit 40.

Figure 5A:
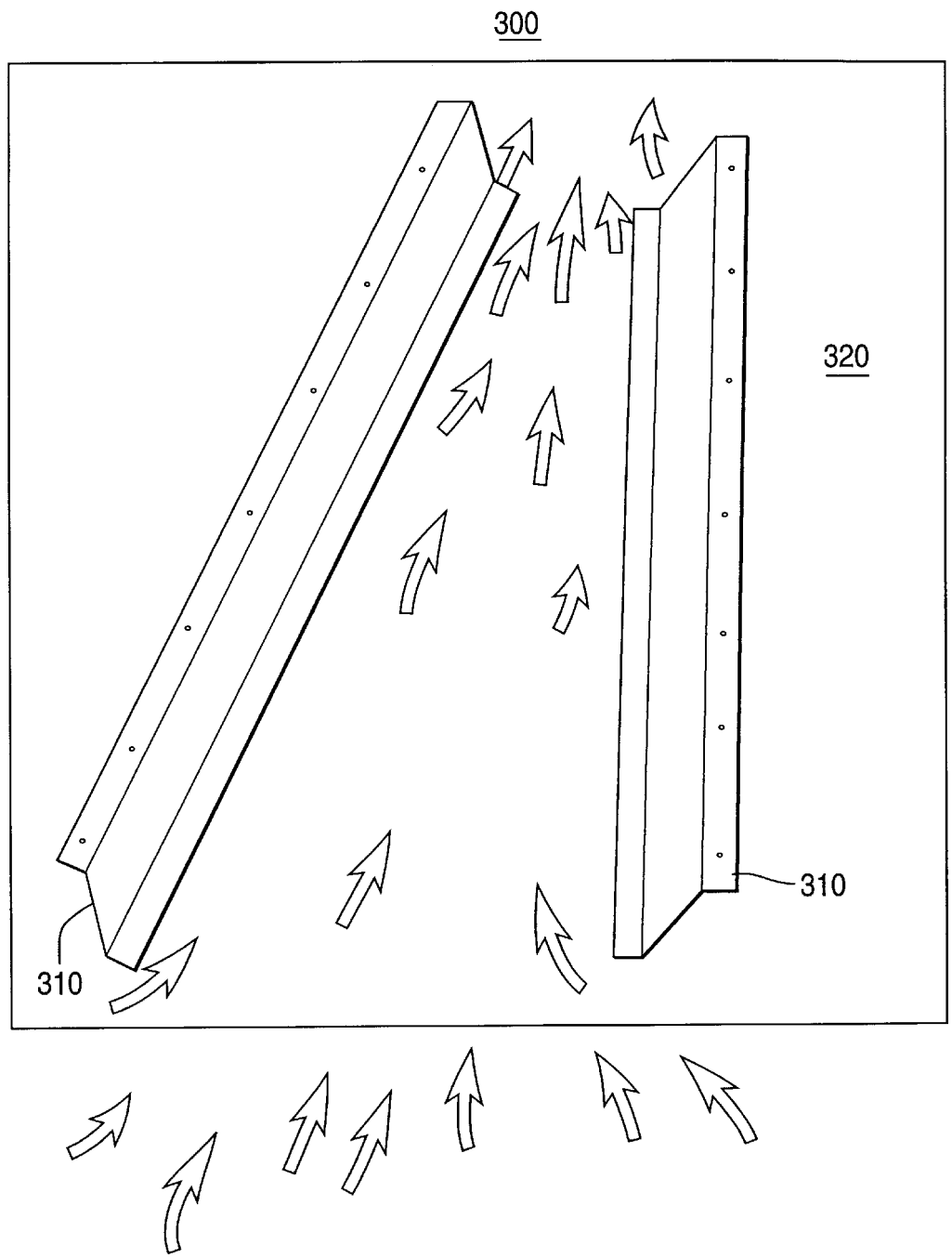
FIG. 5A is a front view of the air concentrator unit comprising two deflection vanes.

Referring to FIG. 5A, the function of the air concentrator unit 300 will now be described in detail. The concentrator unit 300 comprises two deflection vanes 310 which are mounted on a substrate 320. Preferably, the substrate 320 is the same size and shape as other printed circuit boards located within that shelving unit 40. This facilitates simple installation and removal of the air concentrator unit 300 as required.

The first vane 310 is mounted on the substrate 320 in a vertical orientation. The second vane 310 is mounted at an angle with respect to the first vane 310. As the cooling air travels between the two vanes 310, it is forced through a smaller aperture at the top of the vanes 310, thereby increasing the velocity of the flow at the top of the vanes 310. Obviously, when more air flow is directed to a specific component, more heat removal will be effected.

Figure 5B:
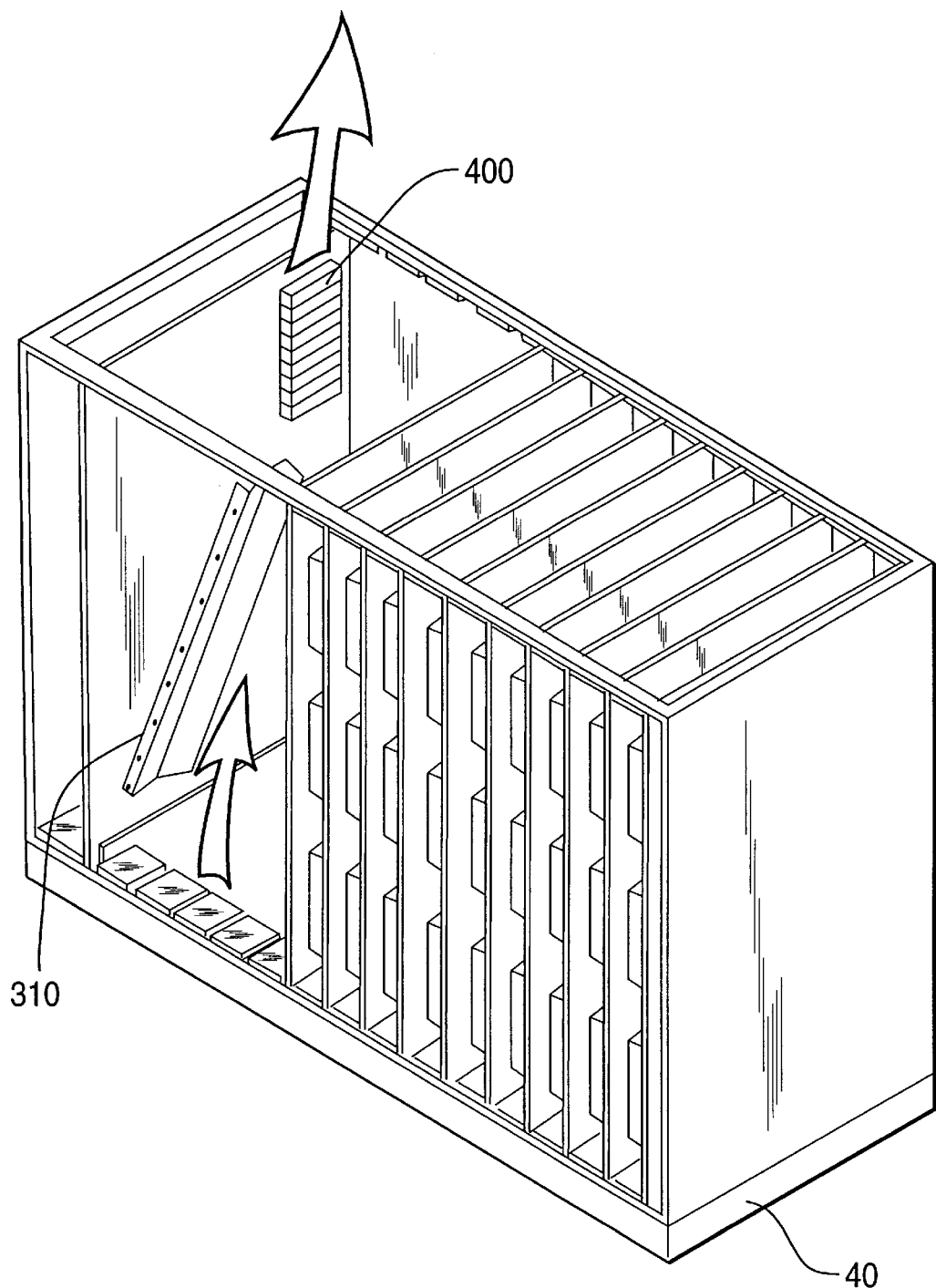
FIG. 5B is a perspective view of the air concentrator unit mounted in a shelving unit.

Referring to FIG. 5B, in operation, air flows from the bottom of the shelving unit 40 and is concentrated by the vanes 310 onto the component 400 having a high thermal output. The concentrator unit 300 is adapted to fit in the same slot as a printed circuit board. Although the high thermal output component 400 is shown as located on the same substrate as the concentrator unit 300, this component may be located in the shelving unit 40 above the shelving unit 40 in which the concentrator unit 300 is housed. Several of the printed circuit boards in the shelving unit 40 shown in FIG. 5B have been removed to better show the concentrator unit 300.

Figure 5C:
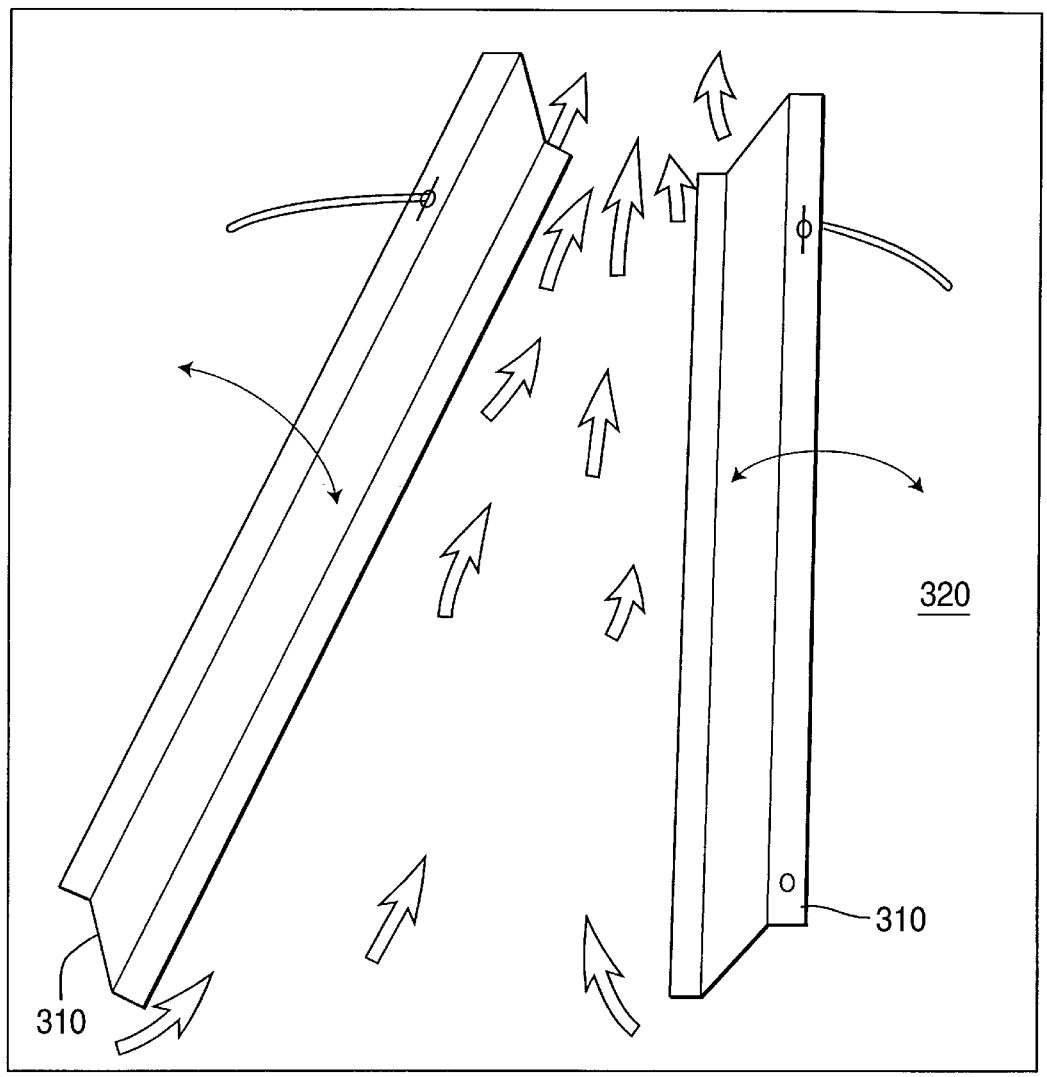
FIG. 5C is an alternative embodiment of the air concentrator.

An alternative embodiment of the air concentrator unit 300 is shown in FIG. 5C. In this embodiment, both vanes 310 are rotatably mounted about an adjustable pivot at the bottom of each vane 310. Slots are provided within the substrate 320 through which a releasable mechanism engages each vane 310 with the substrate 320. In this manner, the vanes 310 may be positioned to reduce or increase flow to a specific component.

The air concentrator unit 300 is preferably used in conjunction with the thermal diffuser 200 to equalize both air temperature and velocity before the air enters the shelving unit 40 above it. Air flow that has been concentrated with increased velocity and heat must be dissipated and mixed with cooler air prior to entry into the next shelving unit. The thermal deflector bracket 230 of the thermal diffuser 200 is used in conjunction with the air concentrator unit 300. Accordingly, when a concentrator unit 300 is used to increase the air velocity over certain components, it is preferable to install a deflector bracket 230 in the thermal diffuser 200 above the air concentrator unit 300.

Figure 6:
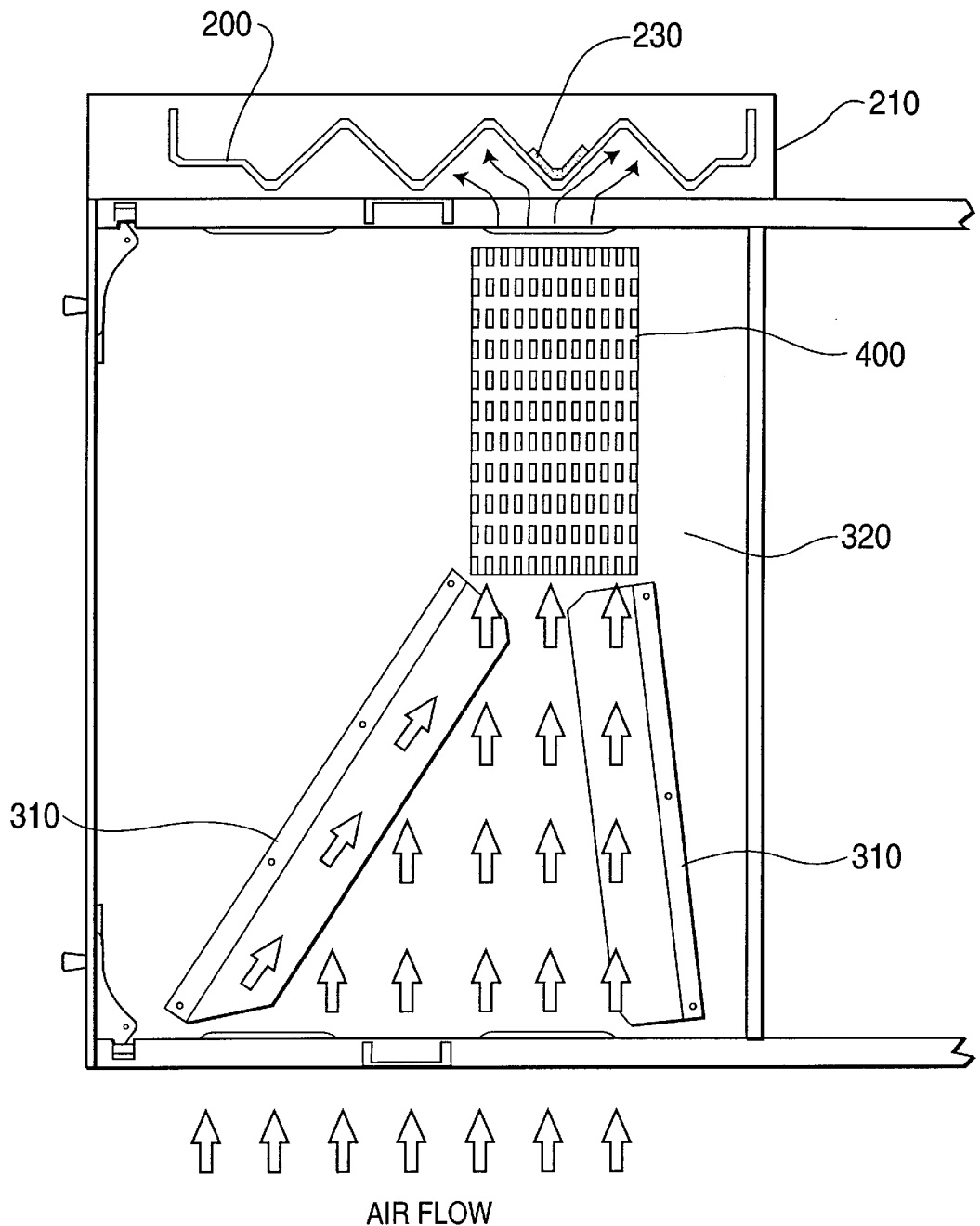
FIG. 6 is the thermal diffuser including a deflector bracket placed in combination with the air concentrator.

In testing, the thermal diffuser 200 including a deflector bracket 230 was placed in the air flow between a lower shelving unit 40 having an air concentrator unit 300 and a power supply having a high heat output, and an upper shelving unit 40 as shown in FIG. 6. The air concentrator unit 300 increased the flow of air cooling the power supply heatsink to 700 CFM. This was double the original velocity before adding the air concentrators unit 300.

The thermal diffuser 200 including the deflector bracket 230 provided mixing of air to equalize the input heat load to the upper shelving unit 40 and to prevent blockage of air flow to the upper shelving unit 40. The thermal diffuser 200 occupied one rack space (1.75" high). The thermal diffuser 200 dissipated the 70 degree Celsius exhaust air. At an ambient of 49 degrees Celsius, the upper shelving unit saw maximum temperatures of 65 degrees Celsius, which is below their rating of 70 degrees Celsius.

Although the invention has been described in part by making detailed reference to certain specific embodiments, such detail is as intended to be instructive rather than restrictive. It will be appreciated by those skilled in the art that many variations may be made in the structure and mode of operation without departing from the spirit and scope of the invention as disclosed in the teachings herein.

What is claimed is:

1. A cooling system for an enclosure which houses a plurality of electronic components, comprising:
    a blower assembly including a plurality of fans, each fan coupled to an air deflection unit for selectively redirecting exhaust air from the fan;
    a thermal diffuser, for mixing warmer and cooler air within the enclosure prior to contacting at least a portion of said plurality of electronic components; and
    an air concentrator, for selectively concentrating air flow to specific electronic components.

2. The system of claim 1 wherein said blower assembly further comprises:
    a housing, having at least one intake plenum and an output plenum, for maintaining said plurality of fans in a select spatial configuration.

3. The system of claim 2 wherein each said air deflection unit further includes a frame and first and second vanes.

4. The system of claim 3 wherein said frame comprises a vertical portion and a horizontal portion which are mounted perpendicular to each other in an L shape; wherein said first vane is mounted on said vertical portion and said second vane is mounted on said horizontal portion.

5. The system of claim 4 wherein said first and second vanes are rigidly attached to said frame.

6. The system of claim 5 wherein said first and second vanes are attached to said frame at a deflection angle with respect to the plane of the frame.

7. The system of claim 6 wherein said deflection angle is 30°.

8. The system of claim 6 wherein said deflection angle is 45°.

9. The system of claim 2, wherein said intake plenum comprises a plurality of apertures and said output plenum comprises a screen.

10. The system of claim 1 wherein said thermal diffuser further comprises:
    a frame;
    a rigid plate disposed within said frame having a plurality of baffles, each baffle having a plurality of apertures, and
    at least one deflector bracket, mounted on one of said baffles; wherein the thermal diffuser directs air flow in different directions to facilitate mixing of warmer and cooler air molecules.

11. The system of claim 1 wherein the air concentrator further comprises:
    a substrate; and
    two deflection vanes selectively mounted on said substrate, each said deflection vane having first and second ends; wherein the first ends of said vanes are mounted closer together than second ends of said vanes.

12. The system of claim 11 wherein each said vane is mounted to said substrate about an adjustable pivot at said second end, and wherein said substrate further includes slots through which a releasable mechanism engages said vanes.

13. A blower assembly for cooling electronic components within a cabinet comprising:
    a plurality of fans;
    a housing, having at least one intake plenum and an output plenum, for maintaining said plurality of fans in a select spatial configuration; and
    a plurality of air deflection units, one coupled to each of said plurality of fans, for selectively redirecting exhaust air from said plurality of fans prior to contacting said electronic components.

14. The assembly of claim 13 wherein each said air deflection unit further includes a frame and first and second vanes.

15. The assembly of claim 14 wherein said frame comprises a vertical portion and a horizontal portion which are mounted perpendicular to each other in an L shape, said first vane being mounted on said vertical portion and said second vane is mounted on said horizontal portion.

16. The blower assembly of claim 15 wherein said first and second vanes are rigidly attached to said frame.

17. The blower assembly of claim 16 wherein said first and second vanes are attached to said frame at a deflection angle with respect to the plane of the frame.

18. The blower assembly of claim 17 wherein said deflection angle is 30°.

19. The blower assembly of claim 17 wherein said deflection angle is 45°.

20. A cooling system for electronic components within a cabinet having at least one fan for producing a flow of air and thermal diffuser, the thermal diffuser comprising:

a frame;

a rigid plate disposed within said frame having a plurality of baffles, each baffle having a plurality of apertures; and at least one deflector bracket, mounted on one of said baffles; wherein the thermal diffuser directs air flow in different directions to facilitate mixing of warmer and cooler air molecules within the cabinet prior to contacting electronic components.

21. The system of claim 20 further comprising:

an air concentrator for selectively concentrating air flow, the air concentrator including:

a substrate; and two deflection vanes selectively mounted on said substrate for deflecting said air flow.

* * * * *